US011750186B2

(12) United States Patent
Braun

(10) Patent No.: US 11,750,186 B2
(45) Date of Patent: Sep. 5, 2023

(54) OVER-TEMPERATURE PROTECTION CIRCUIT

(71) Applicant: RENESAS ELECTRONICS CORPORATION, Tokyo (JP)

(72) Inventor: Hans-Juergen Braun, Duesseldorf (DE)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/960,479

(22) PCT Filed: Jan. 23, 2018

(86) PCT No.: PCT/EP2018/051552
§ 371 (c)(1),
(2) Date: Jul. 7, 2020

(87) PCT Pub. No.: WO2019/145017
PCT Pub. Date: Aug. 1, 2019

(65) Prior Publication Data
US 2020/0343885 A1 Oct. 29, 2020

(51) Int. Cl.
*H03K 17/082* (2006.01)
*H02H 3/08* (2006.01)
(Continued)

(52) U.S. Cl.
CPC ......... *H03K 17/0822* (2013.01); *H02H 3/08* (2013.01); *H02H 5/044* (2013.01); *H03K 17/18* (2013.01); *H03K 2017/0806* (2013.01)

(58) Field of Classification Search
CPC ............... H03K 17/0822; H03K 17/18; H03K 2017/0806; H02H 3/08; H02H 5/044
(Continued)

(56) References Cited

U.S. PATENT DOCUMENTS 6,169,439 B1 * 1/2001 Teggatz ............. H03K 17/0822
327/309
6,987,655 B2 * 1/2006 Kesler ..................... F02P 3/051
361/103
(Continued)

FOREIGN PATENT DOCUMENTS

EP 1 583 119 A2 10/2005
FR 2 826 198 A1 12/2002
(Continued)

OTHER PUBLICATIONS

R. P. Matei, "A class of hysteretic circuits using operational amplifiers," International Symposium on Signals, Circuits and Systems, 2005. ISSCS 2005., 2005, pp. 425-428 vol. 2, doi: 10.1109/ISSCS.2005.1511268 (Year: 2005).*
(Continued)

*Primary Examiner* — Thienvu V Tran
*Assistant Examiner* — Sreeya Sreevatsa
(74) *Attorney, Agent, or Firm* — McDermott Will & Emery LLP

(57) ABSTRACT

An over-temperature protection circuit is described. The circuit comprises an input for sensing a voltage across a transistor, a voltage-to-current converter configured to generate a current in dependence upon the voltage, an accumulator storing a value indicative of power dissipated by the transistor and which depends on the current; and a comparator configured to determine whether the value exceeds a threshold value and, in dependence on the value exceeding the threshold value, to generate a signal to cause the transistor to be switched off.

20 Claims, 9 Drawing Sheets

(51) Int. Cl.
*H02H 5/04* (2006.01)
*H03K 17/18* (2006.01)
*H03K 17/08* (2006.01)

(58) Field of Classification Search
USPC ........................................................ 361/93.1
See application file for complete search history.

(56) References Cited

U.S. PATENT DOCUMENTS

| | | | | |
|---|---|---|---|---|
| 7,960,997 | B2 * | 6/2011 | Williams | H01L 29/7833 |
| | | | | 324/762.09 |
| 8,299,767 | B1 * | 10/2012 | Tuozzolo | H03K 17/0822 |
| | | | | 323/275 |
| 2004/0085697 | A1 | 5/2004 | Kesler et al. | |
| 2006/0077606 | A1 * | 4/2006 | Nakamura | H02P 1/18 |
| | | | | 361/93.1 |
| 2014/0300999 | A1 * | 10/2014 | Zhou | H02H 3/202 |
| | | | | 361/18 |

FOREIGN PATENT DOCUMENTS

| | | | |
|---|---|---|---|
| JP | 2004-236405 A | | 8/2004 |
| JP | 2004236405 A | * | 8/2004 |
| JP | 2013-135274 A | | 7/2013 |
| JP | 2016-012808 A | | 1/2016 |

OTHER PUBLICATIONS

F. Huang and F. Flett, "IGBT Fault Protection Based on di/dt Feedback Control," 2007 IEEE Power Electronics Specialists Conference, Orlando, FL, USA, 2007, pp. 1478-1484, doi: 10.1109/PESC.2007.4342213 (Year: 2007).*
International Search Report issued in corresponding International Patent Application No. PCT/EP2018/051552, dated Aug. 27, 2018.
Transmittal of International Preliminary Report on Patentability and Written Opinion of the International Searching Authority for PCT/EP2018/051552, dated Jul. 28, 2020.
Japanese Notice of Reasons for Refusal issued in corresponding Japanese Patent Application No. 2020-540635, dated Oct. 26, 2021, with English translation.
Japanese Notice of Reasons for Refusal issued in corresponding Japanese Patent Application No. 2020-540635, dated May 17, 2022, with English translation.
European Office Action issued in corresponding European Patent Application No. 18701458.4-1211, dated Aug. 31, 2022.
Japanese Notice of Reasons for Refusal issued in corresponding Japanese Patent Application No. 2020-540635, dated Nov. 15, 2022, with English translation.

* cited by examiner

OVER-TEMPERATURE PROTECTION CIRCUIT

CROSS REFERENCE TO RELATED APPLICATIONS

This application is the U.S. National Phase under 35 U.S.C. § 371 of International Application No. PCT/EP2018/051552, filed on Jan. 23, 2018, the entire contents are hereby incorporated by reference.

FIELD OF THE INVENTION

The present invention relates to an over-temperature protection circuit.

BACKGROUND

Power semiconductor devices, such as power metal-oxide-semiconductor field-effect transistors (MOSFETs) and insulated-gate bipolar transistors (IGBTs), can be used as switching elements (or "switches") for switching inductive and/or resistive loads, such as lamps and LEDs, motors, solenoids and heaters, which are used in automotive, industrial and other applications.

A switching element, such as a MOSFET, may be a discrete component, or it may be integrated into a load switch integrated circuit (IC) or a pre-driver IC.

Integrated switching elements are often provided with over-temperature (OT) protection to ensure that the switching element does exceed a maximum acceptable operating temperature. This can occur, for example, if the resistance of the load drops to a low value or if there is a short circuit. OT protection is usually achieved by providing an OT sensor close to the switching element coupled to a circuit which, in the event of determining that the operating temperature of the switch exceeds the maximum operating temperature, triggers thermal shutdown.

OT protection, however, faces a number of challenges. For example, if the OT sensor is located too close to the switching element, for example inside a guard ring around the switching element, then the sensor may detect localised regions of high temperature ("hot spots") and trigger thermal shutdown in a situation when the device is still operating within acceptable limits. Furthermore, locating the OT sensor inside the guard ring, reduces the active driver area resulting in a larger IC and higher ON-state resistance $R_{ON}$. Although, placing the OT sensor further away from the switching element, outside the guard ring, can help avoid or overcome these drawbacks, it introduces a time delay. In particular, if over temperature occurs, the sensor may detect this condition too late, by which time, the switching element may have suffered irreversible damage.

One solution, described in U.S. Pat. No. 8,299,767 B1, is to dynamically maintain device operation within a safe operating area (SOA) by sensing instantaneous voltage and current of the device, determining, based on the sensed instantaneous voltage and current, a value that represents a power dissipated in the device, using the determined dissipated power and a model of thermal behaviour of the device to model a junction temperature of the device, and controlling operation of the device based on the modelled junction temperature. This, however, is a complex solution.

SUMMARY

According to a first aspect of the present invention there is provided over-temperature protection circuit. The over-temperature protection circuit comprises an input for sensing a voltage across a transistor, an accumulator for storing a value indicative of power dissipated by the transistor and which depends on the voltage, and a comparator configured to determine whether the value exceeds a threshold value and, in dependence on the value exceeding the threshold value, to generate a signal for signalling that the transistor is be switched off.

The circuit can provide a flexible way to shut-down a driver using a safe operating area (SOA) criterion. It can be adapted into an integrated power driver.

The circuit may further comprise a voltage-to-current converter configured to generate a current in dependence upon the voltage, and the value indicative of the power dissipated by the transistor depends on the current. The circuit may further include a current mirror.

The accumulator may comprise a capacitor. The accumulator may comprise an operational amplifier. For example, the operational amplifier and capacitor may be configured as an integrator.

The circuit may comprise a path arranged between the input and a reference level, preferably ground, and the path may comprise a resistor. The resistor preferably has a negative temperature coefficient. The path may further comprise a voltage regulator. The voltage regulator preferably comprises a Zener diode.

The path may further comprise a current source for selectively controlling the value. The current source can deliver a current to decrease the value and so be used to set a recovery time during which the transistor is switched off.

The comparator may comprise at least one Schmitt trigger.

The circuit may further comprise an analogue-to-digital converter configured to decimate the voltage and output a digitised voltage. The comparator may comprise a counter (for example a pulse counter) configured receive a signal dependent on the digitised voltage. The circuit may further comprise a clock arranged to provide a clock signal and a multiplier, the multiplier configured to multiply the digitised voltage and the clock signal to provide a voltage-controlled frequency-multiplied clock signal to the counter. The circuit may include first and second switches arranged to control accumulation and reduction of the counter.

The circuit may include a gate configured to receive an output from the from the comparator and an output from an over-temperature detection circuit and to output a control signal to cause the transistor to be switched off.

According to a second aspect of the present invention there is provided an integrated circuit comprising the circuit of the first aspect of the invention.

The integrated circuit may further comprise control logic and a pre-driver for controlling a driver for controlling switching of the transistor. The integrated circuit may further comprise a driver comprising the transistor.

According to a third aspect of the present invention there is provided a system comprising the integrated circuit of the second aspect of the invention and a load connected to a driver or the driver.

The load may be a motor, lamp or valve.

The system may further comprise a controller in communication with the integrated circuit.

According to a fourth aspect of the present invention there is provided a motor vehicle comprising the circuit of the second aspect of the invention, the integrated circuit of the third aspect of the invention and/or the system of the fourth aspect of the invention.

The motor vehicle may be a motorcycle, an automobile (sometimes referred to as a "car"), a minibus, a bus, a truck or lorry. The motor vehicle may be powered by an internal combustion engine and/or one or more electric motors.

According to a fifth aspect of the present invention there is provided a method of over-temperature protection, the method comprising sensing a voltage across a transistor, storing a value indicative of power dissipated by the transistor and which depends on the voltage and determining whether the value exceeds a threshold value and, in dependence on the value exceeding the threshold value, generating a signal for signalling that the transistor is be switched off.

The method may further comprise generating a current in dependence upon the voltage.

According to a sixth aspect of the present invention there is provided a hardware circuit configured to perform the method of the fifth aspect of the invention.

According to a seventh aspect of the present invention there is provided a computer program which, when executed by a computing device causes the computing device to perform the method the method of the fifth aspect of the invention.

According to an eight aspect of the present invention there is provided a computer program product comprising a computer readable medium, which may be non-transitory, storing or carrying thereon the computer program of the seventh aspect of the invention.

BRIEF DESCRIPTION OF THE DRAWINGS

Certain embodiments of the present invention will now be described, by way of example, with reference to the accompanying drawings, in which.

DETAILED DESCRIPTION OF CERTAIN EMBODIMENTS

Figure 1:
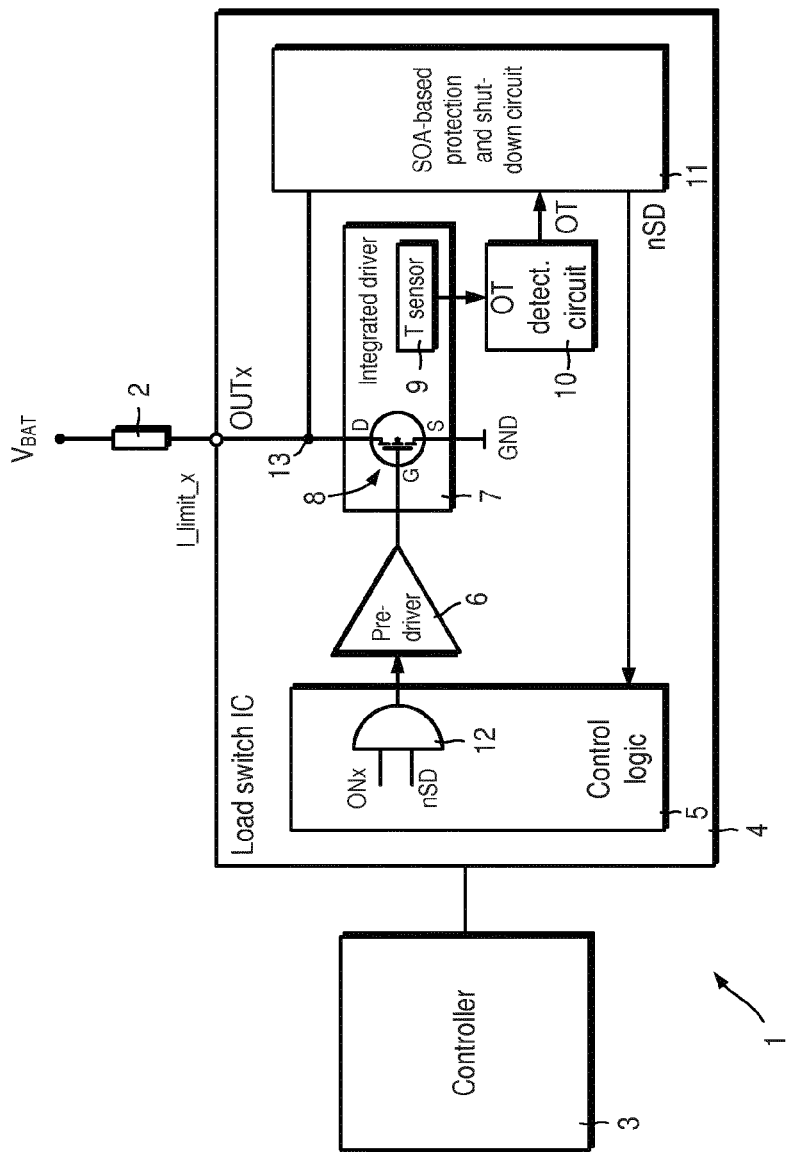
FIG. 1 is a block diagram of a system for controlling and driving a load.

Referring to FIG. 1, a system 1 for controlling and driving a load 2 is shown.

The system 1 includes a controller 3, such as a microcontroller, and a load switch integrated circuit (IC) 4 which includes control logic 5, a pre-driver 6 (or "gate driver") and an integrated driver 7.

The integrated driver 7 includes a switching element 8 in the form of an n-channel, power metal-oxide-semiconductor field-effect transistor (MOSFET) (herein also referred to as an "nMOSFET" or simply "nMOS transistor") and at least one temperature sensor 9.

The MOSFET 8 is configured in a common-source topology. The drain D of the MOSFET 8 is connected to output terminal OUTx of the load switch IC 4. A load 2 is connected between a positive voltage supply, $V_{BAT}$, from a battery, e.g. battery 102 (FIG. 9) and the output terminal OUTx. The source S is connected to ground GND via the switching element 9. In this case, a low-side switching configuration is used. A worst-case drain current, $I_{limit\_x}$, is defined by current limitation.

Behaviour of the temperature sensor(s) 9 is monitored by an over-temperature (OT) detection circuit 10 which is used to determine the presence of an OT condition of the MOSFET 8, for example resulting from a short, which might result in destructive heating of the MOSFET 8.

The load switch IC 4 also includes a safe operating area (SOA)-based over-temperature protection circuit 11 which uses an SOA-based determination to supplement over-temperature detection, and to cause temporary switching-off of the MOSFET 8 using a shutdown enable signal nSD (which is set to LOW in the event of over temperature).

As will be explained later, temperature-based protection and SOA-based protection operate independently. Thus, the MOSFET 8 can be switched off as a result of a temperature sensor 9 directly measuring an over temperature and/or the SOA-based circuit 11 inferring an over-temperature condition.

As will be explained in more detail hereinafter, the SOA-based protection circuit 11 effectively calculates an amount of power dissipated by the MOSFET 8, determines whether the power exceeds a given a threshold and, if so, causes temporary shutdown of the MOSFET 8.

Power P is related to voltage V and current I according to P=IV.

Although it might be preferable to determine current I accurately, this can be hard to achieve in practice. For example, it can be difficult to distinguish between a soft overload (where the current I exceeds a threshold $I_{OC}$) and a short circuit current whose value may be virtually unlimited. Therefore, a defined fast current limitation $I_{limit}$ can be used as a value for the current I. This can be sufficient since current can settle quickly (e.g. within 2 μs). As will be explained, the SOA-based protection circuit 11 can shut off current quickly, for example, in a little as ten or a few tens of microseconds.

If the voltage V is measured and a value of current I is assumed or defined, then a power P or a parameter which depends on power can be calculated simply using voltage V.

Driver control is carried out through a driver control signal ONx. The driver control signal ONx and the shutdown enable signal nSD are inputs to an AND gate 12. The output of the AND gate 12 is supplied to the input of the pre-driver 6.

Figure 2:
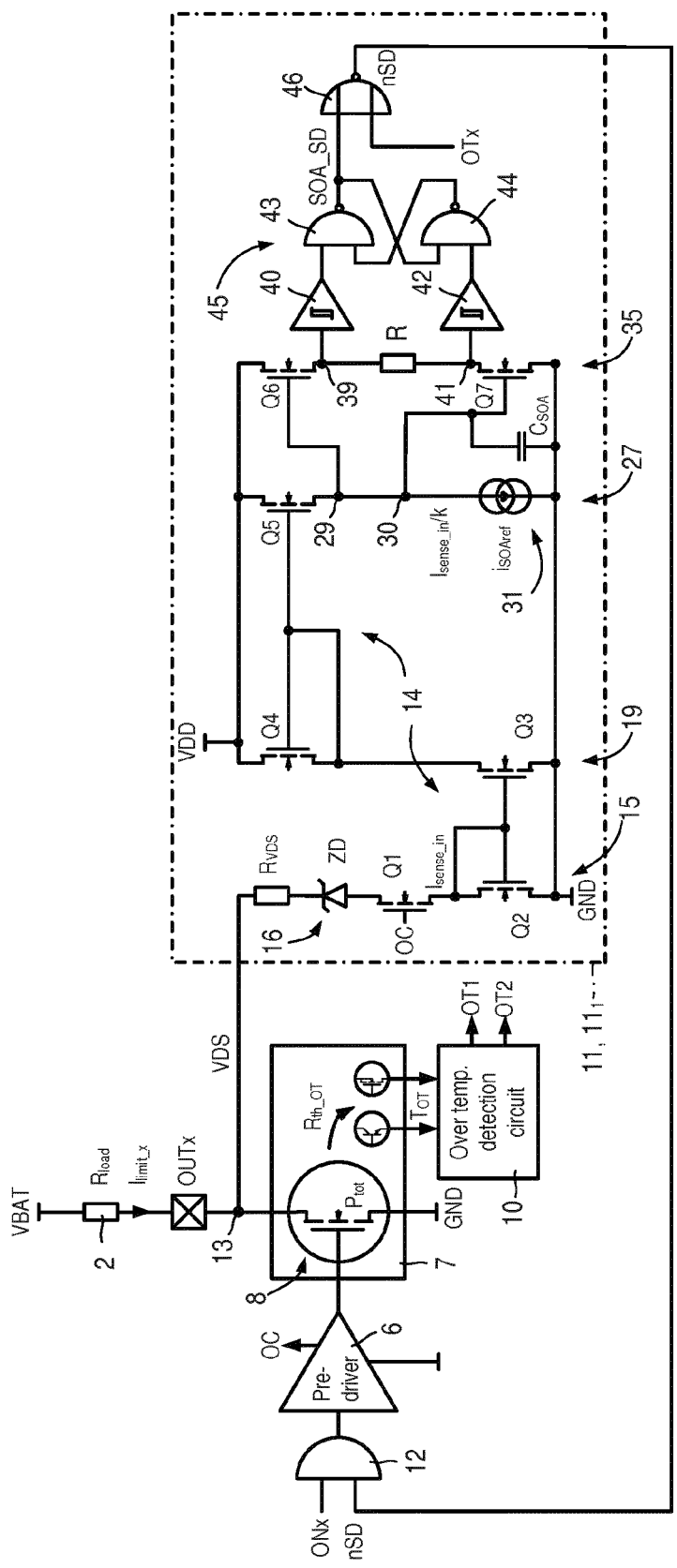
FIG. 2 is a schematic diagram of a load and a load switch which includes an integrated switching element and safe-operating area (SOA) based protection circuit.

Referring to FIG. 2, a first SOA-based protection circuit 11, 11$_1$ is shown.

The circuit 11 senses the source-drain voltage VDS via a tap 13 (or "node") between the output terminal OUTx and the drain D of the MOSFET 8. The source-drain voltage VDS is converted into a current $I_{sense\_in}$ by a sense resistor $R_{VDS}$. The sense resistor $R_{VDS}$ preferably has a negative temperature coefficient to increase shutdown sensitivity at a high temperature, i.e. a high temperature of a substrate on which driver is formed.

A multiple-stage current mirror 14, in this case a two-stage current mirror, is used to generate a scaled-down current scaled by a scaling factor k, where k is about 100. Each stage scales the current by a factor of ten.

A first path 15 runs between the tap 13 and ground GND which comprises the sense resistor $R_{VDS}$, a voltage regulator 16 (which is preferably variable), a channel of a first transistor Q1, in the form of an n-type MOSFET, whose gate is controlled by an over current signal OC supplied by the pre-driver 6 and a channel of second transistor Q2, in the form of an n-type MOSFET. The drain of the second transistor Q2 is connected to its gate. The over current signal OC signals start of an overload event. Below a given threshold $OC_{limit}$, there is no need for shut down. Above the threshold $OC_{limit}$, the circuit 11 starts to operate.

There are two aspects to over current management. First, there is an OC detector 10 which signals an OC event (i.e., when the current $I_{OC}$ rises above a programmable threshold), but which still results in the load 2 being driven with low $R_{ON}$. If the load current increases further, then the driver goes into a current limitation mode. In current limitation mode, the driver acts as a current source with the level I (==$I_{limit\_x}$). While the current is limited, the dissipated power just depends on the voltage drop across the driver. Expressed differently, there is no relevant SOA power dissipation below the OC detection threshold. To help try and guarantee correct normal operation, the SOA shut down circuit will be enabled just in case $I_{OC}$ is exceeded. Thus, the OC detector output can be seen as an ENABLE signal for the entire SOA shut down mechanism.

The voltage regulator 16 takes the form of a Zener diode ZD and is used to set a source-drain voltage threshold VDS_o. The source-drain voltage threshold VDS_o defines the voltage at which the SOA-based circuit 11₁ starts to integrate a power (VDS_o×$I_{limit\_x}$). Expressed differently, the source-drain voltage threshold VDS_o marks the transition from unrestricted permanent power dissipation regime (i.e., which is not SOA critical) to a regime where power dissipation is monitored.

The value of the source-drain voltage threshold VDS_o depends on driver size and application. The value can be fixed, for example, by e-fuse programming (or other form of one-time programming).

The current in the path 15 is the sensed current $I_{sense\_in}$.

A second path 19 runs between ground GND and supply voltage VDD and includes the channel of a third transistor Q3, in the form of an n-type MOSFET, whose gate is connected to the gate of the second transistor Q2, and the channel of fourth transistor Q4, in the form of an n-type MOSFET. The source of the fourth transistor Q4 is connected to its gate.

A third path 27 runs between supply voltage VDD and ground GND, and includes a fifth transistor Q5, in the form of an n-type MOSFET, first and second nodes 29, 30 and a programmable current source 31 which drives a current $i_{SOAref}$. A capacitor $C_{SOA}$ is arranged in parallel with the current source 31, i.e. between second node 30 and ground GND. The current in the third path 27 is a scaled sense current $I_{sense\_in}/k$. Level shifting is used to provide and consistent swing amplitude at node 30.

The capacitor $C_{SOA}$ is used to integrate the scaled sense current $I_{sense\_in}/k$ and, thus, effectively determine the accumulated deposited power.

The values of $i_{SOAref}$, $C_{SOA}$ and/or $R_{VDS}$ are individually set for each driver class.

A fourth path 35 runs between supply voltage VDD and ground GND and includes a sixth transistor Q6, in the form of an n-type MOSFET, a level-setting resistor R (for example having a value of the order of a MΩ, 10s of MΩ) for controlling RS flip-flop operation, and a seventh transistor Q7, in the form of an n-type MOSFET. The gates of the sixth and seventh transistors Q6, Q7 are connected to the first and second nodes 29, 30 respectively.

A fourth node 39 between the source of the sixth transistor Q6 and the level-setting resistor R is connected to the input of a first Schmidt trigger 40. A fifth node 41 between the drain of the sixth transistor Q6 and the level-setting resistor R is connected to the input of a second Schmidt trigger 42.

The outputs of the Schmidt triggers 40, 42 are supplied to first inputs of respective first and second NAND gates 43, 44 whose outputs are provided to the second inputs of the other NAND 43, 44 (i.e. cross-coupled) to provide an RS flip-flop 45.

The output of the first NAND gate 43 (i.e. the non-inverting flip-flop output Q) is the SOA-based shutdown signal SOA_SD supplied to a first input of a third NOR gate 46. The second input of the third NOR gate 46 is an OR combination of over-temperature signals. The output of the third NOR gate 46 is provided as the shutdown enable signal nSD to the driver controller AND gate 12.

A short with a low source-drain voltage VDS leads to longer shut off time. As will be explained in more detail later, there is no shut down below a static power threshold $P_{tot}$. The over-temperature sensor detector takes over shut down and releases the ONx driver control at T<$T_{OT}$, where $T_{OT}$ is the threshold temperature for shut down.

The current $i_{SOAref}$ defines the duration of recovery ("cool down time") which is constant, but can be set for a given driver and an application.

Figure 3:
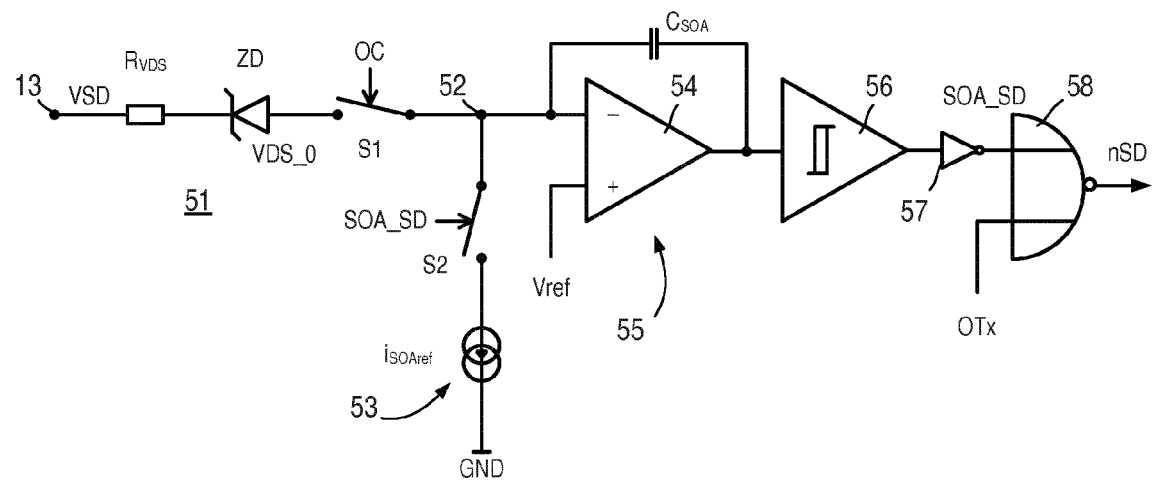
FIG. 3 illustrates another SOA based protection circuit.

Referring to FIG. 3, a second SOA-based protection circuit 11, 11₂ is shown.

The second circuit 11, 11₂ senses the source-drain voltage VDS via the tap 13 between the output terminal OUTx and the drain D of the MOSFET 8 and the source-drain voltage VDS is converted into a current $I_{sense\_in}$ by the sense resistor $R_{VDS}$.

A path 51 runs between the tap 13 and ground GND which comprises the sense resistor $R_{VDS}$, a voltage regulator 16 in the form of a Zener diode ZD, a switch S1 which is controlled by an over current signal OC supplied by the pre-driver 6, a node 52, a second switch S2 which is controlled by the SOA-based shutdown signal SOA_SD and a programmable current source 53 which drives a current $i_{SOAref}$.

The node 52 is connected to the inverting input of an operational amplifier 54 of an integrator 55 comprising the operational amplifier 54 and a feedback capacitor $C_{SOA}$. A voltage reference Vref is connected to the non-inverting input of the operational amplifier 54.

The output of the operational amplifier 54 is connected to the input of a Schmidt trigger 56. The output of the Schmidt trigger 56 is supplied to the input of an inverter 57 whose output is the SOA-based shutdown signal SOA_SD.

The output of the inverter is supplied to a first input of a NOR gate 58. The second input of the NOR gate 58 is an OR combination of over-temperature signals OTx. The output of the NOR gate 58 is provided as the shutdown enable signal nSD to the driver controller AND gate 12.

The second SOA-based protection circuit 11, 11₂ operates in substantially the same way as the first SOA-based protection circuit 11, 11₁.

Figure 4:
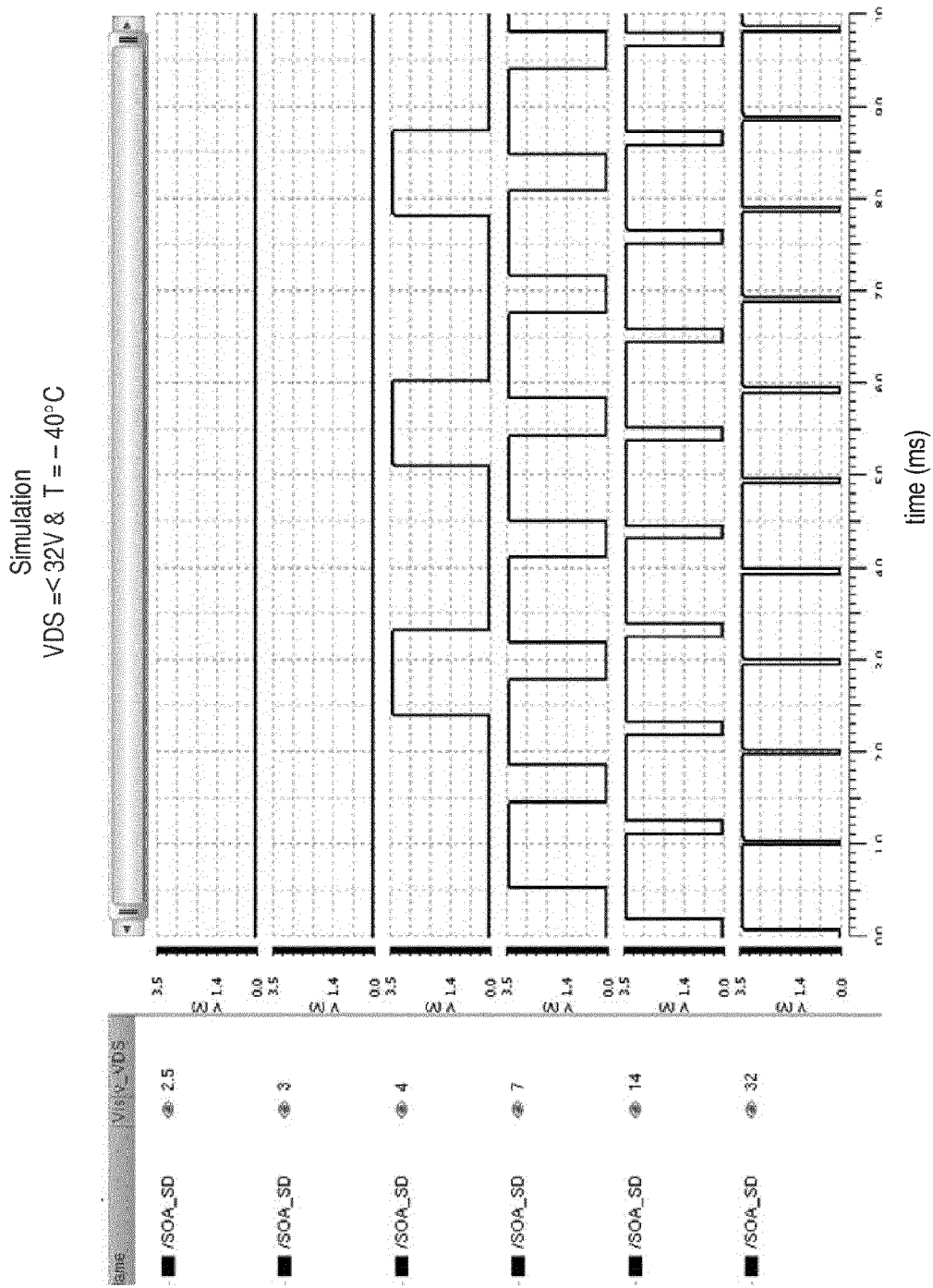
FIG. 4 illustrates simulated results of SOA-based protection for different values of source-drain voltage at −40° C.

FIG. 4 shows simulated results of shutdown signal SOA_SD against time generated by the protection circuit 11 shown in FIG. 2 for six different values of source-drain voltage VSD, namely 2.5 V, 3 V, 4 V, 7 V, 14 V and 32 V, at −40° C.

For source-drain voltages of 2.5 and 3.5 V, there is no shutdown within 10 ms and the shutdown signal SOA_SD stays LOW. For a source-drain voltage of 4 V, the shutdown signal SOA_SD goes HIGH at 2.4 ms and stays HIGH for 0.9 ms. The shutdown signal SOA_SD goes HIGH again at 5.1 ms and stays HIGH for 0.9 ms. As the source-drain voltage increases the duty cycle of shutdown signal SOA_SD increases.

Figure 5:
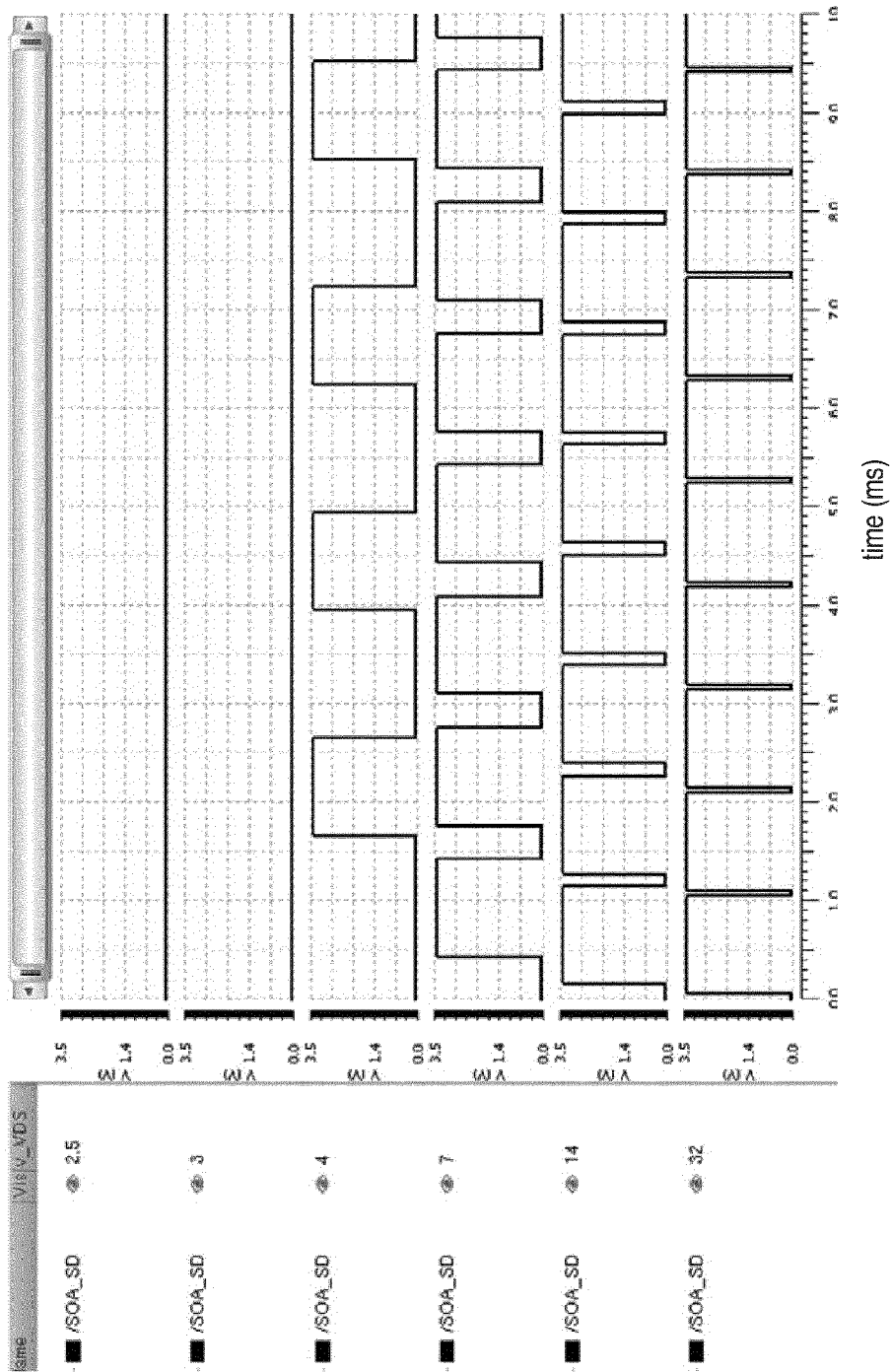
FIG. 5 illustrates simulated results of SOA-based protection for different values of source-drain voltage a room temperature at 25° C.

FIG. 5 shows simulated results of shutdown signal SOA_SD against time generated by the protection circuit 11 shown in FIG. 2 for the same values of source-drain voltage VSD at 25° C.

The results at 25° C. are similar to those for −40° C., although the duty cycles are slightly higher for corresponding source-drain voltages.

Figure 6:
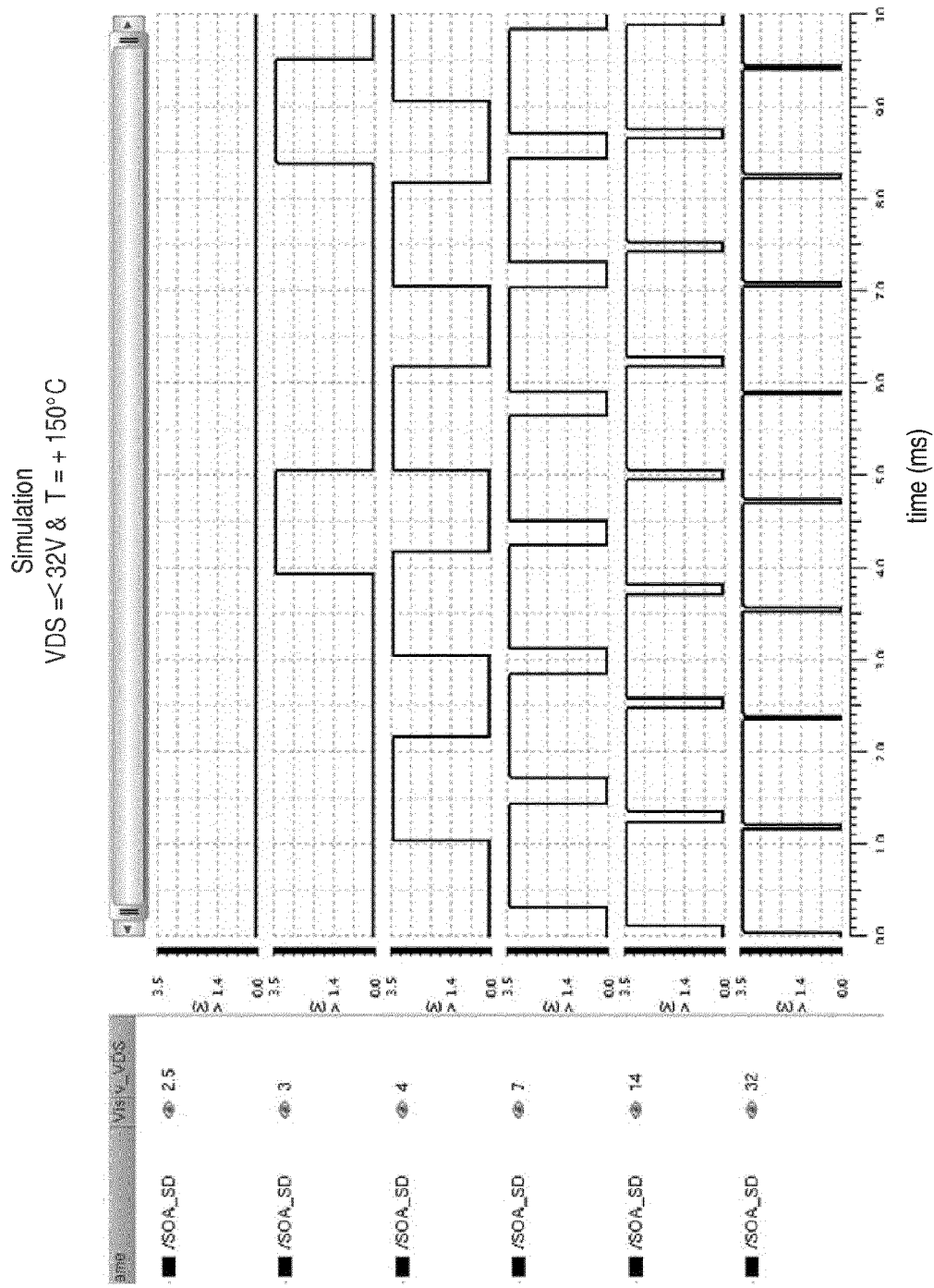
FIG. 6 illustrates simulated results of SOA-based protection for different values of source-drain voltage a room temperature at 150° C.

FIG. 6 shows simulated results of shutdown signal SOA_SD against time generated by the protection circuit 11 shown in FIG. 2 for the same values of source-drain voltage VSD at 150° C. The results show that the shutdown signal SOA_SD starts to go HIGH at a lower source-drain voltage, namely 3 V.

Figure 7:
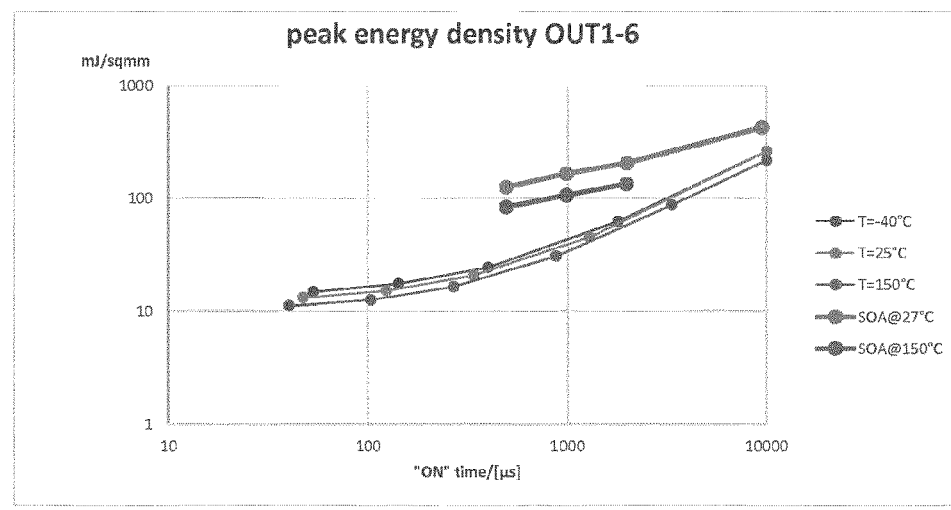
FIG. 7 illustrates simulated results of peak-energy density against ON time for an active area of 1 mm$^2$.

FIG. 7 show plots of calculated energy density per square millimetre (in mJmm$^{-2}$) again ON time (in μs) for a driver area of 0.8 mm$^2$ for three different ambient temperatures, namely— 40° C., 25° C. and 150° C. FIG. 6 also shows plots of the measured, maximum safe operating area energy density against ON time for a correspondingly sized device at −27° C. and 150° C.

The ON resistance is 350 mΩ, and a thermal resistance Rth is 5.5 KW$^{-1}$. For the calculation, I_limit_max (i.e., $I_{limit\_x}$) is 6.9 A. The peak dissipated power is calculated by multiplying I_limit_max by VDS. The average current is calculated by multiplying I_limit_max by D, where D is the duty cycle. The average dissipated power is calculated by multiplying peak dissipated power by D. Peak energy is calculated by multiplying peak power by ON time. Peak energy density is calculated by multiplying peak energy by driver area. Average junction temperature is calculated by adding the ambient temperature (i.e. −40° C., 25° C. or 150° C.) to the average dissipated power multiplied by the thermal resistance.

As shown in FIG. 7, the calculated energy density per square millimetre are approximately the same at −40° C., 25° C. and 150° C. increasing exponentially with ON time, but staying well within the safe operating area.

Figure 8:
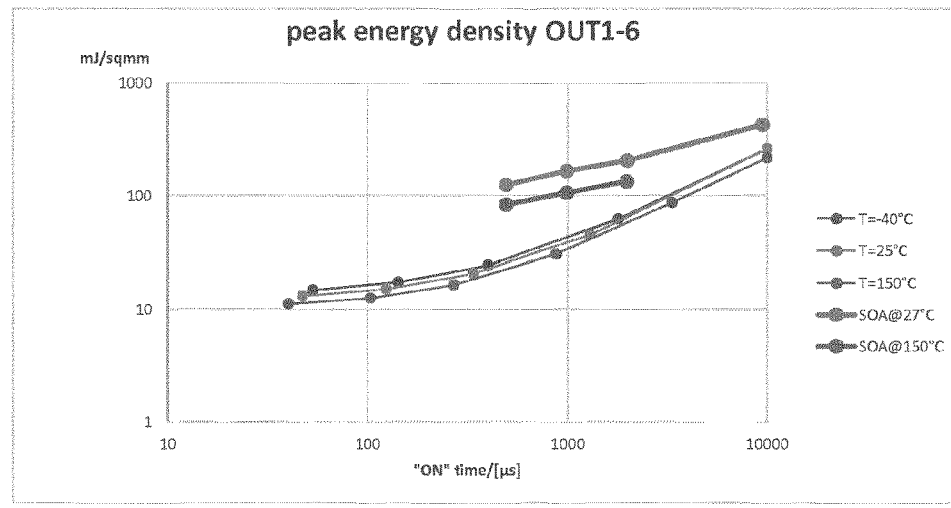
FIG. 8 illustrates simulated results of peak-energy density against ON time for an active area of 0.67 mm$^2$.

FIG. 8 show plots of calculated energy density per square millimetre again ON time for a driver area of 0.61 mm$^2$ for the same three ambient temperatures. In this case, the ON resistance is 720 mΩ, and a thermal resistance Rth is 7.2 KW$^{-1}$. For the calculation, I_limit_max is 4.1 A.

Figure 9:
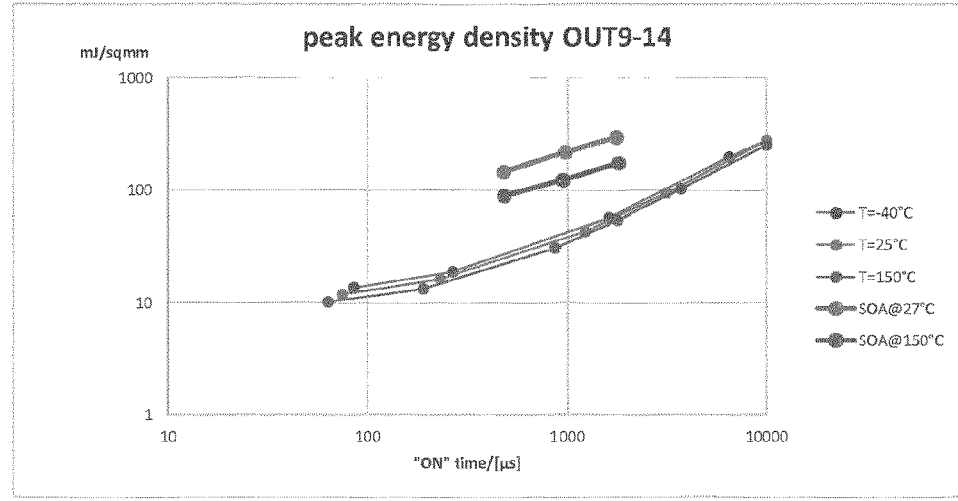
FIG. 9 illustrates simulated results of peak-energy density against ON time for an active area of 0.25 mm$^2$.

FIG. 9 show plots of calculated energy density per square millimetre again ON time for a driver area of 0.28 mm$^2$ for the same three ambient temperatures. In this case, the ON resistance is 2,400 mΩ, and a thermal resistance Rth is 15.8 KW$^{-1}$. For the calculation, I_limit_max is 1.4 A.

The SOA-based protection circuits 11 hereinbefore described are implemented by an analogue circuit. SOA-based protection, however, can be implemented by a digital circuit as will now be described in more detail.

Figure 10:
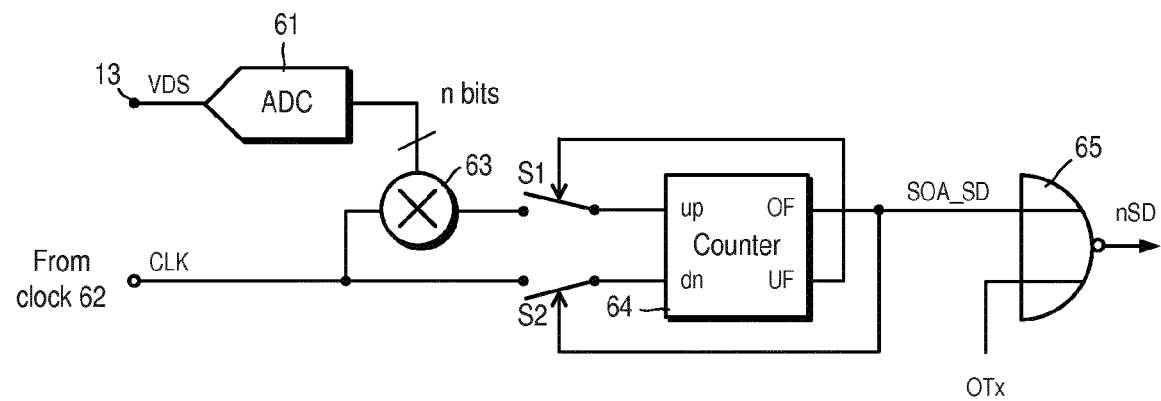
FIG. 10 illustrates a digital safe-operating area (SOA) based protection circuit.

Referring to FIG. 10, a digital SOA-based protection circuit $11_3$ is shown.

The circuit 11e includes an analogue-to-digital converter 61 which decimates the source-drain voltage VSD and outputs an n-bit voltage signal.

A clock signal CLK from a clock 62 digital voltage signal is frequency-multiplied by voltage signal using a multiplier 63. The multiplied digital voltage signal and the clock signal are supplied, via respective first and second switches S1, S2, to count-up and count-down inputs of a bi-directional pulse counter 64. The a source-drain voltage threshold VDS_o is considered inside the ADC 61 as an appropriate offset similar to the offset provided by the Zener diode ZD (FIG. 2) in the analogue system. The overflow interrupt flag OF controls the second switch S2, i.e., the CLK signal supplied to the count-down input and the underflow interrupt flag UF controls the first switch S1, i.e. the multiplied digital signal.

The overflow interrupt flag OF SOA-based shutdown signal SOA_SD and is supplied to a NOR gate 65 in the same way as the analogue-based circuits $11_1$, $11_2$.

Figure 11:
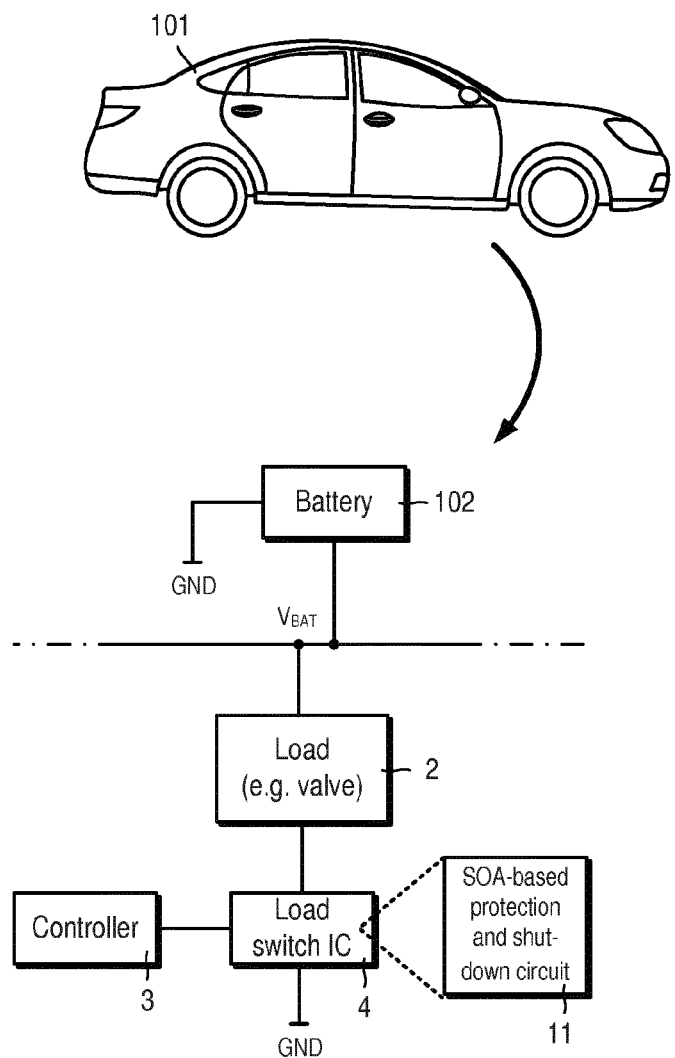
FIG. 11 illustrates a motor vehicle which comprises a system for controlling and driving a load.

Referring to FIG. 11, a motor vehicle 101 is shown.

The motor vehicle 101 includes a battery 102 and a plurality of different loads 2, for example motors, supplied with power from the battery 102 and each controlled by a respective load switch 4 which is controlled by a controller 3. An SOA-based protection and shut down circuit 11 can be provided in a load switch 4.

Modifications

It will be appreciated that various modifications may be made to the embodiments hereinbefore described. Such modifications may involve equivalent and other features which are already known in the design, manufacture and use of load switch drivers and component parts thereof and which may be used instead of or in addition to features already described herein. Features of one embodiment may be replaced or supplemented by features of another embodiment.

The nMOS transistor 6 may be a discrete component or may be integrated into a load switch IC or into the pre-driver IC 4.

Although claims have been formulated in this application to particular combinations of features, it should be understood that the scope of the disclosure of the present invention also includes any novel features or any novel combination of features disclosed herein either explicitly or implicitly or any generalization thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

The invention claimed is:

1. An over-temperature protection circuit comprising:
    an input for sensing a voltage at a first node arranged between an output terminal and a drain of a first transistor;
    a voltage-to-current converter configured to generate a current in dependence upon the voltage, the voltage-to-current converter comprising a resistor which is comprised in a first path arranged between the input and a reference level;
    an accumulator including a capacitor arranged to integrate the current or a scaled current obtained from the current and to provide an output; and
    a comparator configured to:
        determine whether the output exceeds a threshold output, wherein the output exceeding the threshold output is an inference of an over-temperature condition; and in dependence on the output exceeding the threshold output, generate a signal for signaling that the first transistor is to be switched off.

2. The over-temperature protection circuit of claim 1, further comprising:
a current mirror.

3. The over-temperature protection circuit of claim 1, wherein the resistor has a negative temperature coefficient.

4. The over-temperature protection circuit of claim 1, wherein the first path further comprises:
a voltage regulator.

5. The over-temperature protection circuit of claim 4, wherein the voltage regulator comprises:
a Zener diode.

6. The over-temperature protection circuit of claim 1, wherein the first path further comprises:
a current source for driving a control current for delivering a current to decrease the output of the accumulator and to set a recovery time during which the first transistor is switched off.

7. The over-temperature protection circuit of claim 1, further comprising:
a gate configured to receive an output from the comparator and an output from an over-temperature detection circuit and to output a control signal to cause the first transistor to be switched off.

8. An integrated circuit comprising:
the over-temperature protection circuit of claim 1.

9. The integrated circuit of claim 8 further comprising: control logic; and
a pre-driver for controlling a driver for controlling switching of the first transistor.

10. The integrated circuit of claim 8, further comprising:
a driver comprising the first transistor.

11. A system comprising:
the integrated circuit of claim 8; and
a load connected to a driver or the driver.

12. The system of claim 11, wherein the load is a motor.

13. The system of claim 11, wherein the load is a valve.

14. The system of claim 11, further comprising:
a controller in communication with the integrated circuit.

15. A motor vehicle comprising:
the over-temperature protection circuit of claim 1.

16. The over-temperature protection circuit of claim 1, wherein the first path arranged between the input and the reference level is different from a second path between the first node and the output terminal.

17. The over-temperature protection circuit of claim 1, wherein the over-temperature protection comprises a second path which runs between a supply voltage and a reference level, the second path comprising:
a second transistor having: a gate terminal arranged to receive the output; a drain terminal connected to the supply voltage; and a source terminal connected to a second node;
a third transistor having: a gate terminal arranged to receive the output; a drain terminal connected to a third node; and a source terminal connected to the reference level; and
a level-setting resistor connected between the second node and the third node.

18. The over-temperature protection circuit of claim 17, wherein the comparator comprises;
a first Schmidt trigger having: an input connected to the second node; and an output;
a second Schmidt trigger having: an input connected to third node; and an output; and
an RS flip-flop arranged to be supplied with: the output of the first Schmidt trigger; and the output of the second Schmidt trigger,
wherein the level-setting resistor is for controlling operation of the RS flip-flop, and
wherein the signal for signaling that the first transistor is be switched off is an output of the RS flip-flop.

19. The over-temperature protection circuit of claim 18, wherein the RS flip flop comprises:
a first NAND gate having: a non-inverting input arranged to receive the output of the first Schmidt trigger; an inverting input; and an output; and
a second NAND gate having: a non-inverting input connected to the output of the first NAND gate; an inverting input arranged to receive the output of the second Schmidt trigger;
and an output connected to the inverting input of the first NAND gate, wherein the signal for signaling that the transistor is be switched off is the output of the first NAND gate.

20. The over-temperature protection circuit of claim 1, wherein the accumulator comprises an integrator comprising an operational amplifier and the capacitor,
wherein the comparator comprises a Schmidt trigger and an inverter,
wherein an input of the Schmidt trigger is connected to an output of the accumulator,
wherein an output of the Schmidt trigger is connected to an input of the inverter, and
wherein the signal for signaling that the transistor is be switched off is an output of the inverter.

* * * * *